United States Patent

Davis et al.

Patent Number: 5,528,134
Date of Patent: Jun. 18, 1996

[54] AC POWER ANALYZER

[75] Inventors: Gerald W. Davis, Franklin; Michael L. Gasperi, Caledonia, both of Wis.

[73] Assignee: Allen-Bradley Company, Inc., Milwaukee, Wis.

[21] Appl. No.: 399,073

[22] Filed: Mar. 8, 1995

[51] Int. Cl.⁶ .................................................. G01R 23/16
[52] U.S. Cl. .................. 324/76.24; 324/76.21; 324/76.38; 324/76.58; 364/485; 361/76
[58] Field of Search .......................... 364/485; 324/76.24, 324/76.21, 76.38, 76.58; 361/76

[56] References Cited

U.S. PATENT DOCUMENTS

| 4,504,786 | 3/1985 | Slaughter | 324/76.21 |
| 4,646,004 | 2/1987 | Brandt | 324/76.24 |

FOREIGN PATENT DOCUMENTS

| 2276975 | 11/1990 | Japan | 324/76.24 |

Primary Examiner—Kenneth A. Wieder
Assistant Examiner—Jose M. Solis
Attorney, Agent, or Firm—Keith M. Baxter; John M. Miller; John J. Horn

[57] ABSTRACT

A harmonic analyzer using a short sampling window eliminates truncation artifacts in the sampling of an AC power waveform by equating the length of the sample period to a period of the sampled waveform. The period of the AC power waveform is estimated from the waveform and used to produce a set of "resampled" points evenly spaced within that period as estimated from the sampled. By performing a spectrum analysis on the resampled points, artifacts at the harmonic intervals are reduced to zero.

6 Claims, 3 Drawing Sheets

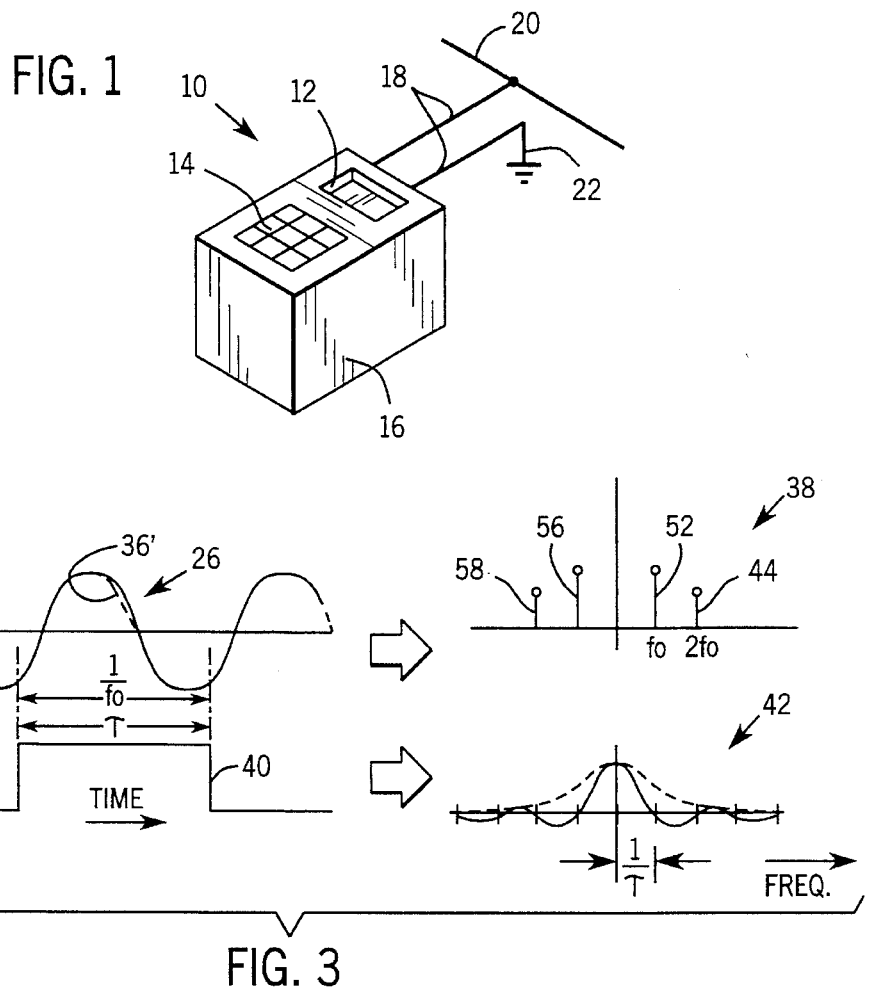
FIG. 1
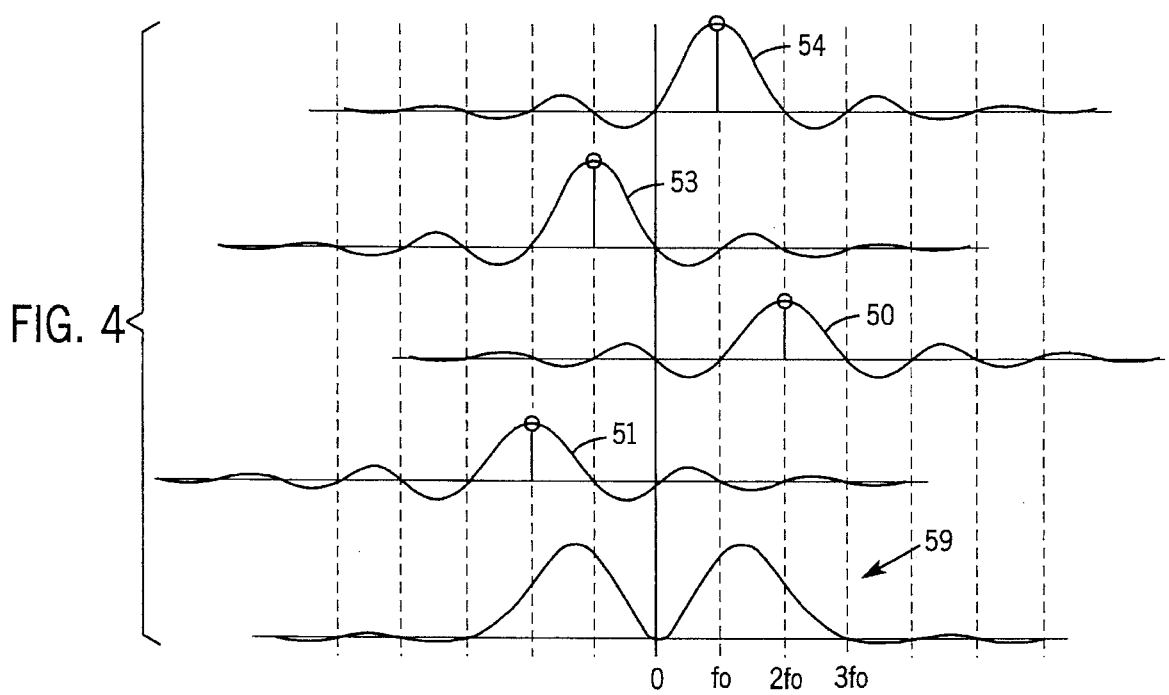
FIG. 3
FIG. 4

AC POWER ANALYZER

FIELD OF THE INVENTION

The invention relates generally to instruments for analyzing power disturbances on AC power lines and more particularly to a high accuracy harmonic analyzer for measuring the amplitude of harmonics of fundamental AC line frequency.

BACKGROUND OF THE INVENTION

Sources of alternating current ("AC") electrical power may be adversely affected by attached electrical loads which distort the phase and shape of the AC power waveform. Dynamic loads imposed, for example, by rotating electrical equipment and in particular by motor controller power supplies, can change the AC waveform from its normal sine wave shape.

Distortion of the AC power waveform can be quantified by spectral analysis. A pure AC sine wave at a line frequency (60 Hz in the United States, 50 Hz in Europe) will exhibit only a single spectral component at that line frequency, whereas a distorted waveform will exhibit a number of spectral components at higher frequencies. These higher spectral components describe the amplitude of a series of sine waves whose sum produces the distorted waveform shape.

For distortion of the AC waveform that remains constant from cycle to cycle, the frequencies of the spectral components will be a harmonic or integer multiple of the fundamental AC waveform line frequency. For example if the line frequency is 60 Hz, the distortion will cause spectral components at the first, second, and third harmonics (120 hertz, 180 hertz, 240 hertz) and so on. Current standards for AC waveform fidelity require measurement of the amplitudes of harmonics of the fundamental frequency up to the 41st harmonic. An accuracy of within 1% of the amplitude of the fundamental frequency is also required.

Because the harmonic content of the AC line voltage can vary rapidly, it is desired that such measurements be made for relatively short lengths of waveform data, for example, in as little as one cycle. Unfortunately, measurements of the harmonic components on such short durations of waveform data has proven relatively inaccurate.

SUMMARY OF THE INVENTION

The present invention has recognized that the inaccuracy attendant to harmonic analysis of short intervals of waveform data can be avoided by carefully matching the interval length to a single cycle of the fundamental component of the AC waveform. This matching shifts an artifact in spectral analyses, created by truncation of the continuous waveform to the short interval, away from the harmonic points to be measured thus preventing this artifact from interfering with the harmonic measurements.

Specifically, the present invention is a harmonic analyzer that includes a data acquisition circuit communicating with the AC power to be analyzed to produce a set of digital sample values representing values of the AC power waveform at a first plurality of points in time over a sample interval. The digital sample values are saved in a storage means and a waveform estimator, which may review the data so stored, determines an estimated period of the fundamental frequency of the AC power waveform. This estimate may be obtained, for example, by evaluating zero crossings of that waveform.

A resampler then receives the digital sample values from the storage device and provides new estimated sample values for a second plurality of points in time with respect to the estimated period. A spectrum analyzer measures these estimated sample values at integer multiples of the period of the fundamental frequency of the AC waveform.

Thus, it is one object of the invention to provide a high accuracy harmonic analysis of an AC waveform that may operate on an extremely short duration of AC waveform. By matching the sampled interval to the estimated waveform period, sample window artifacts are eliminated.

The estimated sample values may be generated by interpolating the digital sample values to the second plurality of points in time or by rebinning the acquired sample values to the closest estimated sample values in time.

Thus, it is another object of the invention to implement a high accuracy harmonic analyzer in a manner that reduces the computational overhead of the harmonic analyzer processor.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

BRIEF DESCRIPTION OF THE DRAWINGS

FIG. 1 is a perspective view of a power analyzer according to the present invention as attached to an AC power line;

FIG. 3 is a graph showing a typical AC waveform above a graph of a sample window waveform having a width equal to the period of the AC waveform, and to the right of each of the AC waveform and the sample window waveform, its spectral representation;

FIG. 4 is a graph of the spectrum obtained when the AC waveform of FIG. 3 is sampled for the sampling window waveform of FIG. 3 showing the components of that spectrum positioned above the spectrum, each being a sinc function resulting from the convolution of the two spectra of FIG. 3, and further showing that all but one component has a value of zero at each harmonic frequency when the sampling window is equal in duration to the fundamental period of the AC waveform;

DETAILED DESCRIPTION OF THE PREFERRED EMBODIMENT

Figure 2:
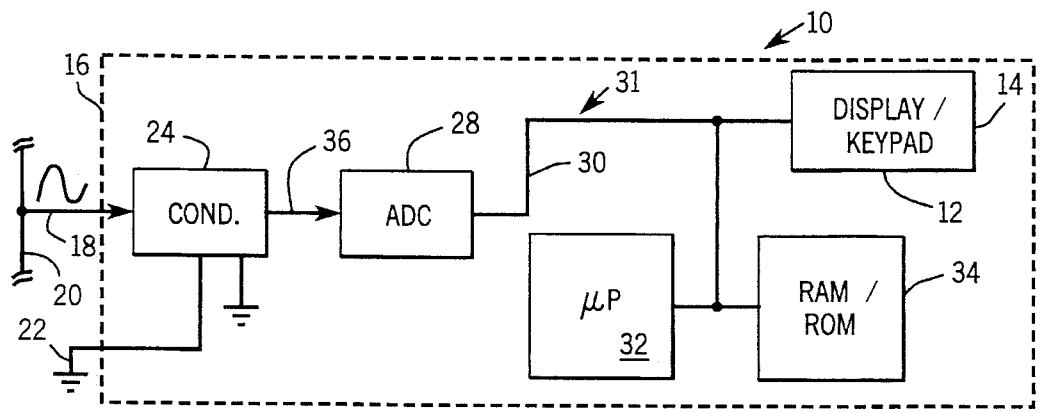
FIG. 2 is a block diagram of the circuitry of the power analyzer of FIG. 1.

Referring now to FIG. 1, a harmonic analyzer 10 of the present invention provides a display 12 for displaying amplitude measurements of the harmonics of a measured AC waveform and keypad 14 for entering user data, for example, the number of the harmonic to be displayed. Both the display 12 and keypad 14 are attached to a housing 16 containing analysis circuitry to be described below. First and second test leads 18 are provided at one end of the housing to be attached to an AC power source 20 and a ground reference 22.

Referring now to FIG. 2, the test leads 18 connected to the AC power source 20 and ground 22 are received by conditioning circuitry 24 which protects the harmonic analyzer 10 from excess voltages and current or reverse voltage through the use of protection devices well known in the art.

After conditioning, the AC voltage waveform 36 from the power source 20 is received by an analog to digital converter ("ADC") 28 which samples the AC voltage waveform 36 at approximately 10,000 Hz and digitizes the sampled values to provide a set of digital samples 30 to an internal bus 31 according to commands by a microprocessor 32.

The bus 31 comprises address and data lines and operates under the control of the microprocessor 32, also to provide communication between the microprocessor 32 and other devices on the bus 31 including a memory 34 comprised of random access and read only memory devices, the display 12 and the keypad 14.

The memory 34 stores the digital samples 30 of the AC voltage waveform 36, as converted to digital words by the ADC 28, and also contains a program controlling the microprocessor 32 so that it may analyze the digital samples 30 as will be described. The memory 34 also contains variables used by the microprocessor 32 during the calculations it will undertake.

Referring now to FIG. 3, generally the AC power source 20 will provide a voltage waveform 36 having a frequency of $f_0$ and hence a period of $1/f_0$. AC voltage waveform 36 may deviate from a true sinusoid 36' at certain portions caused by varying loads on the AC power source 20. These deviations will be reflected in a spectrum of the AC voltage waveform 36 as harmonic components at a frequency greater than $f_0$. In the spectrum 38, the AC voltage waveform 36 may be represented by a sine wave component at frequency $f_0$ and a second sine wave component (first harmonic) at $2f_0$.

In FIG. 3, the spectrum 38 is plotted as a two sided line spectrum where the spectra to the left of the ordinate is the mirror image of the spectrum to the right of the ordinate and represent complex phasors rotating in opposite directions to phasors represented by the spectrum to the right of the ordinate. Together the two phasors add to produce the real valued AC voltage waveform 36. The lines in the spectrum 38 are equivalent to Dirac delta functions $\delta(f)$ times the amplitude of the sine wave component they represent. The Dirac delta function has a unit area concentrated at a single point.

A sampling waveform 40 (plotted beneath the AC voltage waveform 36) has a value of zero except for an interval of length $\tau$ where it has a value of one and during which a sampling of the AC voltage waveform 36 occurs. In this case $\tau$ is set equal to the period of the AC voltage waveform 36 or $1/f_0$. As will be discussed further below, the phase of the sampling waveform 40 with respect to the phase of the AC voltage waveform 36 is unimportant. Thus, the rising edge of the sampling waveform need not be synchronized with, for example, the crest or zero crossing of the AC voltage waveform 36.

A spectra 42 of the sampling waveform 40 takes the form of a sinc function where:

$$\text{sinc}(x) = \frac{\sin \tau x}{\pi x} . \qquad (1)$$

Importantly, the sinc function spectrum of the sampling waveform is centered about the ordinate and crosses the abscissa at regular intervals at integer multiples of $1/\tau$ and thus integer multiples of $f_0$ because as described before:

$$\tau = \frac{1}{f_0} \qquad (2)$$

Referring now also to FIG. 4, sampling the AC voltage waveform 36 for the period $\tau$ is equivalent to multiplication of the AC voltage waveform 36 by the sampling waveform 40, that is, only points where the sampling function is one are sampled and other points remain zero.

Multiplication in the time domain (i.e., the multiplication of the AC voltage waveform 36 by the sampling waveform 40) is the same as convolution in the frequency domain. That is, the spectra of the sampled AC voltage waveform 36 will be equal to the convolution of spectrum 38 of the AC voltage waveform 36 and the spectrum 42 of the sampling waveform 40.

The convolution of the two spectra, e.g., 38 and 42 is defined as:

$$f_1(f) * f_2(f) = \int_{-\infty}^{\infty} f_1(\lambda) f_2(f - \lambda) d\lambda$$

38, $f_2$ is a spectra 42, the asterisk is the convolution operator. Convolution in this case involves flipping $f_2$ with respect to its dependent variable (integration variable $\lambda$), offsetting $f_2$ with respect to the $f_1$ by the value of $f$ being evaluated and then integrating the product of the functions over time.

This process is much simplified for the purpose of the present invention because one of the spectrum 38 is comprised of lines which are Dirac delta functions, as described above. The convolution of the spectra 38 and 42 may be treated as the sum of separate convolutions of each line of spectrum 38 with spectrum 42. And the convolution of a single Dirac delta function and the spectrum 42 is simply the spectrum 42 shifted by the offset of the Dirac delta function from zero and multiplied by the amplitude of the spectral component represented by that Dirac delta function.

Thus, the convolution of the sinc function of spectrum 42 with the lines 44 and 52 of the spectra 38 is simply the sum of a series a sinc functions offset by $-2f_0$, $-f_0$, $f_0$, and $2f_0$ as shown by waveforms 51, 53, 54 and 50, respectively.

The resultant spectra 59 obtained by the convolution of spectra 38 and 42 is the sum of waveforms 54, 50, 53, and 51. It is notable in that at the harmonic values $f_0$, $2f_0$, $3f_0$ . . . etc, only one of the waveforms 54, 53, 50 and 51 contributes to the composite spectra 59. All of the others have zero values. Hence, a measurement of the spectra 59 at the harmonic values will reveal the height of the line spectra in spectrum 38 (i.e., the amplitude of only one component of the spectrum 38) without influence by the sampling waveform 40.

The present invention recognizes that this ability to measure the relative heights of lines 52 and 44 in spectrum 38, after it has been sampled and hence convolved with spectrum 42, will only be possible if the width of the sampling waveform 40 equals the period of the fundamental of the AC voltage waveform 36 as shown in FIG. 3.

Figure 5:
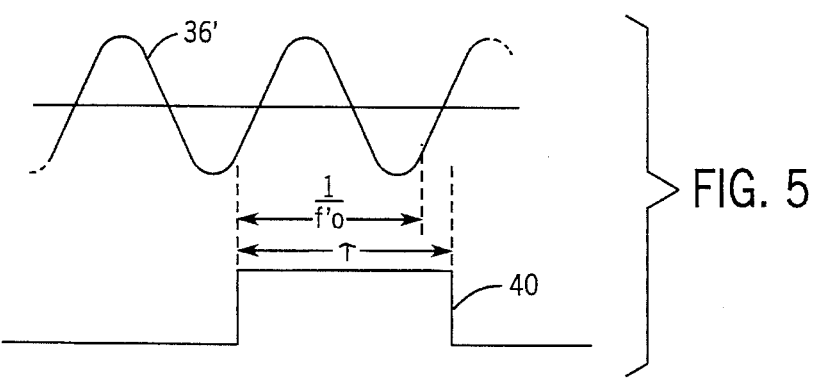
FIG. 5 is a graph similar to FIG. 3 showing a typical AC waveform and a sampling window wherein the window is not of a duration equal to the fundamental period of the AC waveform.
Figure 6:
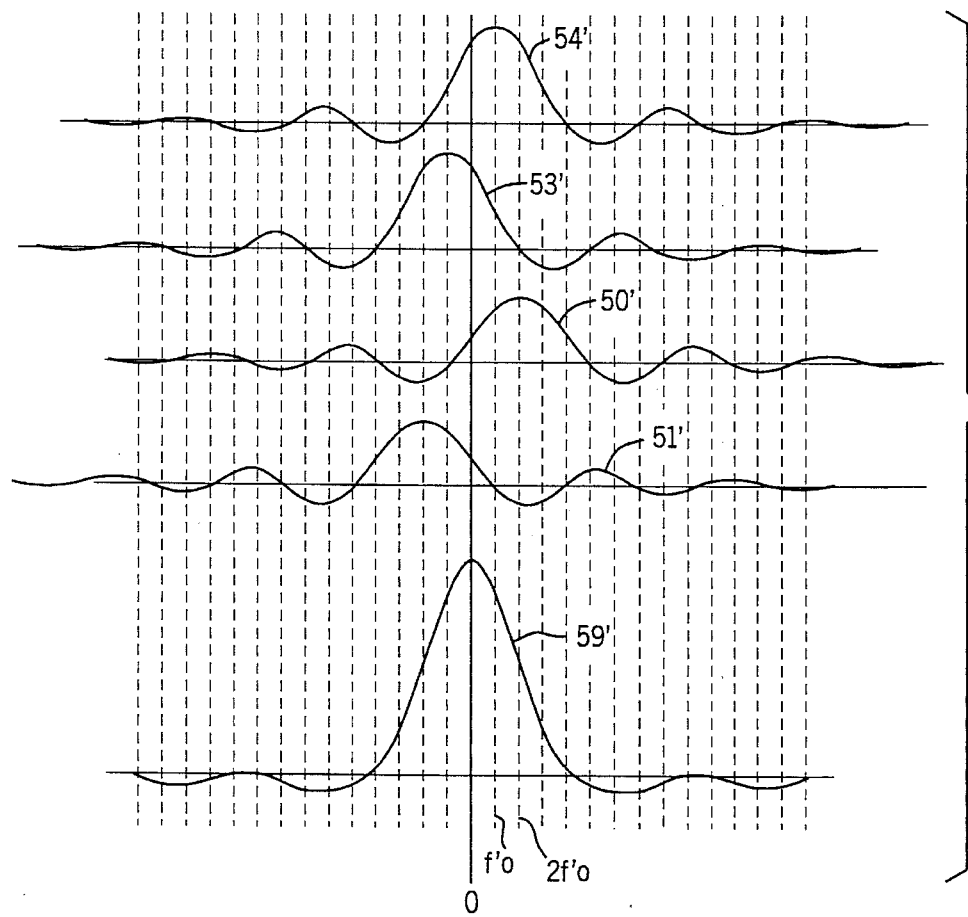
FIG. 6 is a spectra similar to that of FIG. 4 but for the waveforms of FIG. 5 and in particular showing that no longer are all but one co-ponent of the spectrum of FIG. 6 zero at the harmonic frequencies.

Referring now to FIG. 5, if for example, the length τ of the sampling waveform 40' is substantially greater than the period of the AC voltage waveform 36 ($1/f_0$), the sinc functions resulting from the convolution of spectra 38 and 42 shown as waveforms 54', 53', 50' and 51' will no longer align so as to have zero values at the harmonics $f_0$ and $2f_0$. This is because, although the width of the sinc function has remained the same (in this case), the frequency $f_0$ of the AC voltage waveform 36 has increased reducing its period $1/f_0$. Thus, the centers of the sinc functions in the waveforms 54', 53', 50' and 51' are no longer positioned so that their zeros overlap other harmonics.

Therefore, if one looks at the spectra 59', being the sum of waveforms 54', 53', 50' and 51', and thus the result of the convolution of the spectra of waveform 36' and sampling waveform 40 caused by the sampling of waveform 36', then a measurement of the height of that spectra 59' at, for example $f_0$, will not reveal the height of the fundamental frequency component of the AC voltage waveform 36' (reflected in the height of waveform 54' at $f_0$) but will be corrupted with contributions from waveforms 53', 50', and 51' as well. The contributions from these other waveforms 53', 50' and 51' distorted the measurement of the harmonic at $f_0$.

Figure 7:
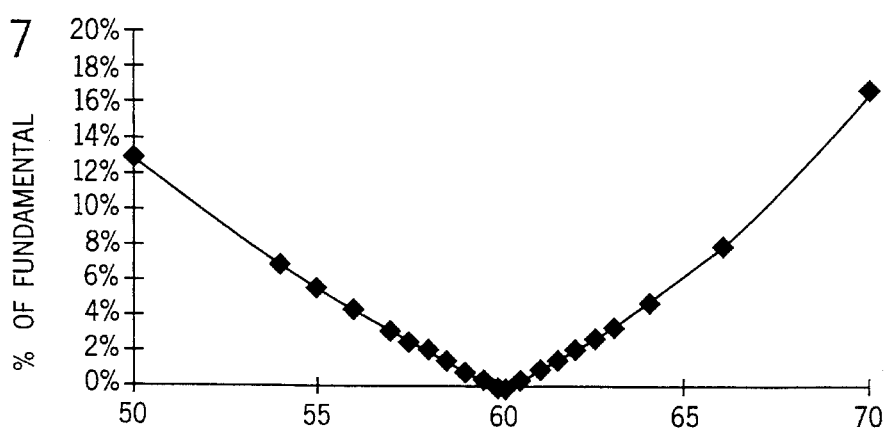
FIG. 7 is a plot of the error introduced in the measurement of the second harmonic of the AC waveform caused by failure to match the sampling window to the fundamental period of the AC waveform.

Referring now to FIG. 7, the error produced by the sampling process can be considerable rising above 1%, for example, if the fundamental frequency $f_0$ of the AC waveform deviates by more than a few Hz from 60 cycles assuming a sampling window of 1/60 seconds. Thus, it is critical that the sampling window closely match in width the period of the fundamental of the AC waveform being measured for harmonic measurements to be accurately computed with short window times.

Figure 8:
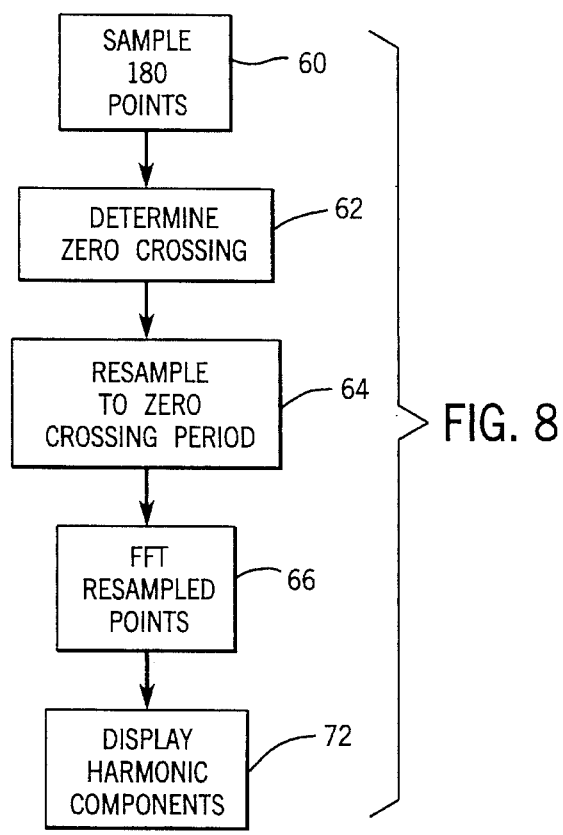
FIG. 8 is a flow chart providing the steps of the sampling and spectrum analysis of the present invention including the step of resampling the AC waveform to match an estimated period of the AC waveform.

Referring now to FIGS. 1 and 8, the present invention provides such a matching through a resampling technique. At process block 60, the microprocessor 32 collects in memory 34 approximately 180 sampled points of the AC voltage waveform 36 which are collected over a period of time somewhat greater than the period of the lowest frequency component of the AC voltage waveform 36 expected to be present. That is, the 180 points represent at least a full cycle of the AC voltage waveform 36.

Next at process block 62, the microprocessor 32 operating under instructions within the memory 34, identifies three zero crossings of the sampled AC voltage waveform 36 as stored in memory 34. The time between the first and last zero crossing is determined based on a counting of the number of samples between these zero crossings and that value is taken as the period $1/f_0$ of the fundamental frequency $f_0$ of the AC voltage waveform 36. It will be recognized that other methods of estimating this period could be used and that this estimation might be performed by separate analog timer circuitry operating independently of the microprocessor 32 and directly on the AC waveform from the power source 20 rather than as stored in memory.

At process block 64, the 180 sampled points stored in ROM are resampled to 256 evenly spaced time values between the first and third zero crossings. Generally, these 256 resampled points will have different values than the 180 sampled points because of the difference in number of points, i.e. 180 vs. 256.

The value of each of the 256 resampled points is determined by looking at the sampled points on either side each resampled point and interpolating between them according to techniques well known in the art. Generally, a simple linear interpolation can be used, however, more complex higher order interpolation could be used provided additional points are examined.

Figure 9:
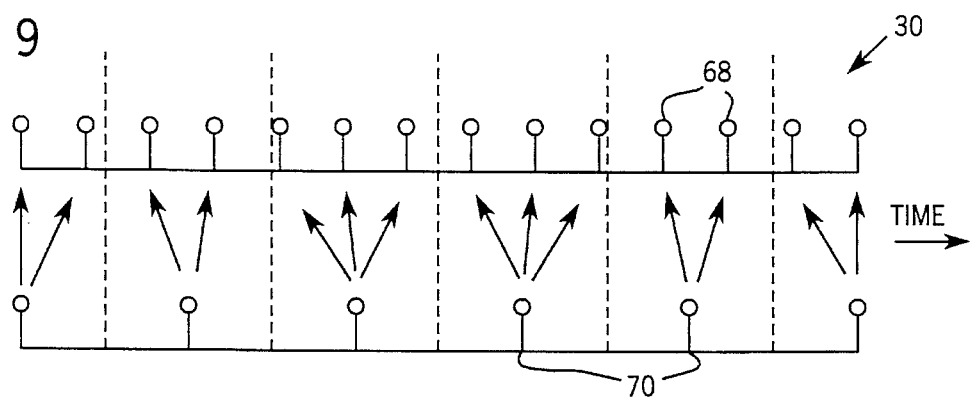
FIG. 9 is a graphical representation of one method of resampling the AC waveform by rebinning the sample values.

Referring now to FIG. 9, in the preferred embodiment, an extremely fast resampling is performed in which the resampled points 68 take on the value of the closest sampled point 70 to the resampled point 68 in time. Generally, there will be more resampled points 68 than sampled points 70. Thus, for each resampled point 68, a value may be obtained by identifying the closest sampled point 70 and simply setting the value of the resampled point 68 to that closest sample point 70.

256 resampled points 68 provide a convenient number for the "Fast Fourier transform" (FFT) which works most efficiently on numbers of data points that are an integer power of 2, (e.g. $256=2^8$).

Referring again to FIG. 8 at process block 66, the resampled points 68 are operated on by the FFT to produce the spectrum generally being similar to that of FIG. 4 spectrum 59. Finally at process block 72, the values of that spectrum 59 at the harmonics are displayed on display 12.

Thus the present invention, by pre-estimating the period of the fundamental frequency of the waveform to be analyzed, can obtain accurate harmonic analysis with extremely short samples of the waveform to be analyzed. In this manner, a cycle by cycle harmonic analysis could be performed to extremely high accuracy.

The above description has been that of a preferred embodiment of the present invention. It will occur to those that practice the art that many modifications may be made without departing from the spirit and scope of the invention. In order to apprise the public of the various embodiments that may fall within the scope of the invention, the following claims are made.

We claim:

1. A harmonic analyzer for determining the harmonic content of an AC power waveform having a fundamental frequency and harmonic components, the analyzer comprising:

(a) a data acquisition circuit communicating with the AC power waveform and producing a set of digital sample values representing the values of the AC power waveform at a first plurality of points in time over a sample interval;

(b) a storage means for storing the digital sample values for the sample interval;

(c) a waveform period estimator providing an estimate of the period of the fundamental frequency of the AC power waveform for the sample interval;

(d) a resampler receiving the digital sample values for the sample period and providing estimated sample values corresponding to the digital sample values for the period of the fundamental frequency and for a second plurality of points in time not identical with the first plurality of points in time; and (e) a spectrum analyzer for measuring the harmonic components of the AC power waveform based on the estimated sample values only for the period of the fundamental frequency of the AC waveform.

2. The harmonic analyzer of claim 1 wherein the waveform period estimator includes:

a zero crossing detector detecting the zero crossings of the AC power waveform; and a timer for determining the time between zero crossings as the period of the AC power waveform.

3. The harmonic analyzer of claim 2 wherein the waveform period estimator communicates with the storage means to estimate the period of the AC power waveform from the set of digital sample values.

4. The harmonic analyzer of claim 1 wherein the resampler produces the estimated sample values by interpolating the digital sample values to the second plurality of points in time.

5. The harmonic analyzer of claim 1 wherein the resampler produces the estimated sample values by assigning the estimated sample values at each one of the second plurality of points with the digital sample values of a one of the first plurality of points closest in time to the one of the second plurality of points.

6. The harmonic analyzer of claim 1 wherein the second plurality of points is equal in number to two raised to an integer power and wherein the spectrum analyzer is an electronic computer executing the fast Fourier transform.

\* \* \* \* \*